(12) United States Patent
Hu et al.

(10) Patent No.: US 12,538,605 B2
(45) Date of Patent: Jan. 27, 2026

(54) BACK CONTACT SOLAR CELL AND SOLAR CELL MODULE

(71) Applicant: Trina Solar Co., Ltd, Changzhou (CN)

(72) Inventors: Yunyun Hu, Changzhou (CN); Jianpeng Zong, Changzhou (CN); Binglun Han, Changzhou (CN); Wei Liu, Changzhou (CN); Daming Chen, Changzhou (CN)

(73) Assignee: Trina Solar Co., Ltd, Jiangsu (CN)

( * ) Notice: Subject to any disclaimer, the term of this patent is extended or adjusted under 35 U.S.C. 154(b) by 0 days.

(21) Appl. No.: 18/896,481

(22) Filed: Sep. 25, 2024

(65) Prior Publication Data

US 2025/0160043 A1    May 15, 2025

(30) Foreign Application Priority Data

Nov. 9, 2023    (CN) .......................... 202311485039.2

(51) Int. Cl.
| | | |
|---|---|---|
| *H10F 77/1223* | (2025.01) | |
| *H10F 19/90* | (2025.01) | |
| *H10F 77/20* | (2025.01) | |

(52) U.S. Cl.
CPC ....... *H10F 77/1223* (2025.01); *H10F 19/908* (2025.01); *H10F 77/219* (2025.01)

(58) Field of Classification Search
CPC .............. H01L 31/068; H01L 31/0682; H01L 31/0352; H01L 31/035272–03529;
(Continued)

(56) References Cited

U.S. PATENT DOCUMENTS

| | | | |
|---|---|---|---|
| 2009/0308438 A1* | 12/2009 | De Ceuster | ........... H10F 10/146 257/E31.032 |
| 2012/0042945 A1 | 2/2012 | Ji et al. | |

(Continued)

FOREIGN PATENT DOCUMENTS

| | | |
|---|---|---|
| AU | 2024216358 A1 | 9/2024 |
| CN | 104282782 A | 1/2015 |

(Continued)

OTHER PUBLICATIONS

Office Action dated Dec. 15, 2023 in corresponding Chinese Patent Application No. 202311485039.2 (Chinese language), 7 pages.
(Continued)

*Primary Examiner* — Christina Chern
(74) *Attorney, Agent, or Firm* — HOVEY WILLIAMS LLP

(57) ABSTRACT

This present application provides a back contact solar cell and solar cell module, comprising: a substrate, provided with a substrate front surface and a substrate back surface opposite to each other, wherein the substrate front surface is close to a main-light-receiving surface of the cell, and the substrate back surface is close to a non-main-light-receiving surface of the cell; P-type polarity region, including a first doped semiconductor layer; N-type polarity region, including a second doped semiconductor layer, the N-type polarity region and the P-type polarity region are alternately located on side of the substrate back surface, wherein, a thickness of the second doped semiconductor layer along a normal direction of the cell is smaller than a thickness of the first doped semiconductor layer along the normal direction; and an isolation region, located between each two adjacent N-type polarity region and P-type polarity region. The back contact solar cell and solar cell module provided by this application can take into account the electrical and optical properties of the solar cell, further improving the short-
(Continued)

circuit current, open-circuit voltage and photoelectric conversion efficiency of the solar cell.

15 Claims, 1 Drawing Sheet

(58) Field of Classification Search
CPC .... H10F 77/14; H10F 77/147; H10F 77/1223; H10F 77/311; H10F 77/16; H10F 77/164; H10F 77/166; H10F 19/90–908
See application file for complete search history.

(56) References Cited

U.S. PATENT DOCUMENTS

| | | | |
|---|---|---|---|
| 2015/0263193 | A1 | 9/2015 | Chung et al. |
| 2016/0027951 | A1 | 1/2016 | Shim et al. |
| 2017/0179325 | A1* | 6/2017 | Chung .............. H01L 31/02167 |
| 2018/0083149 | A1 | 3/2018 | Kim et al. |
| 2022/0393052 | A1 | 12/2022 | Qiu et al. |
| 2023/0197865 | A1 | 6/2023 | Chen et al. |

FOREIGN PATENT DOCUMENTS

| | | |
|---|---|---|
| CN | 105322042 | 2/2016 |
| CN | 107845689 | 3/2018 |
| CN | 113284967 A | 8/2021 |
| CN | 214043686 U | 8/2021 |
| CN | 113394304 A | 9/2021 |
| CN | 214898462 U | 11/2021 |
| CN | 113921625 A | 1/2022 |
| CN | 113921626 A | 1/2022 |
| CN | 216488083 U | 5/2022 |
| CN | 115832065 A | 3/2023 |
| CN | 116314396 A | 6/2023 |
| CN | 116314415 A | 6/2023 |
| CN | 219350240 U | 7/2023 |
| CN | 116613226 A | 8/2023 |
| CN | 116666468 | 8/2023 |
| EP | 2980858 A2 | 2/2016 |
| EP | 4432370 A2 | 9/2024 |
| JP | 2006-332273 A2 | 12/2006 |
| JP | 2011-233657 A2 | 11/2011 |
| JP | 2013-172121 A2 | 9/2013 |
| WO | WO2012017517 A1 | 2/2012 |
| WO | WO2023110534 A1 | 6/2023 |

OTHER PUBLICATIONS

Office Action dated Dec. 15, 2023 in corresponding Chinese Patent Application No. 202311485039.2 (English language), 5 pages.
Machine Translation of CN116666468, 9 pages.
Office Action (Chinese language) dated Oct. 30, 2024 in corresponding Chinese Divisional Patent Application No. 202410082594.9, 6 pages.
Office Action (English translation) dated Oct. 30, 2024 in corresponding Chinese Divisional Patent Application No. 202410082594.9, 6 pages.
Machine translation of CN216488083, 11 pages.
Machine translation of CN113921625, 14 pages.
Machine translation of CN116314396, 9 pages.
Machine translation of CN116314415, 8 pages.
Machine translation of CN115832065, 17 pages.
Office Action (Chinese language) dated Aug. 1, 2024 in corresponding Chinese Divisional Patent Application No. 202410082594.9, 7 pages.
Office Action dated Nov. 14, 2024 in corresponding Australian Patent Application No. 2024219509, 8 pages.
Machine translation of CN214898462, 15 pages.
Machine translation of CN116613226, 14 pages.
Office Action dated Jan. 7, 2025 in corresponding Japanese Patent Application No. 2024-040227, 4 pages.
Machine Translation of Office Action dated Jan. 7, 2025 in corresponding Japanese Patent Application No. 2024-040227, 4 pages.
Machine Translation of JP2006332273, 8 pages.
Machine Translation of JP2011233657, 11 pages.
Machine Translation of JP2013172121, 5 pages.
Machine Translation of WO2012017517, 10 pages.
Office Action dated May 23, 2025 in corresponding European Patent Application No. 24202300.0, 9 pages.
Machine Translation of CN113394304, 12 pages.
Machine Translation of CN214043686, 5 pages.
Machine Translation of CN104282782, 61 pages.
Machine Translation of CN219350240, 8 pages.
Machine Translation of CN113921626, 10 pages.
Machine Translation of CN113284967, 74 pages.
Office Action (Chinese language) dated Oct. 11, 2025 in corresponding Chinese Patent Application No. 202410082594.9, 9 pages.
Machine Translation of Office Action dated Oct. 11, 2025 in corresponding Chinese Patent Application No. 202410082594.9, 9 pages.
Third Party Request Notice (Chinese language) dated Dec. 3, 2024 in corresponding Chinese Patent No. 202311485039.2, 6 pages.
Machine Translation of Third Party Request Notice dated Dec. 3, 2024 in corresponding Chinese Patent No. 202311485039.2, 3 pages.
Third Party Request (Chinese language) dated Feb. 28, 2025 in corresponding Chinese Patent No. 202311485039.2, 25 pages.
Machine Translation of Third Party Request dated Feb. 28, 2025 in corresponding Chinese Patent No. 202311485039.2, 25 pages.
Office Action dated Oct. 23, 2025 in corresponding European Patent Application No. 24202300, 8 pages.

* cited by examiner

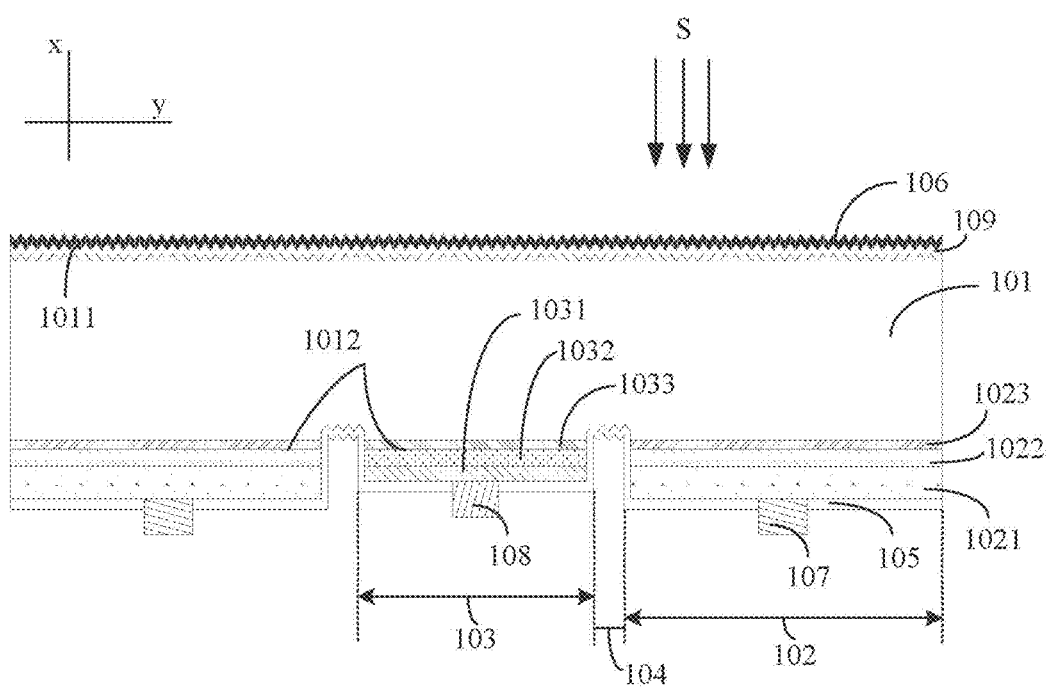

BACK CONTACT SOLAR CELL AND SOLAR CELL MODULE

CROSS-REFERENCE TO RELATED APPLICATION

The present non-provisional patent application claims priority to Chinese Patent Application No. 202311485039.2, filed Nov. 9, 2023, and entitled "Back Contact Solar Cell and Solar Cell Module." The entirety of the above identified Chinese patent application is hereby incorporated by reference into the present non-provisional patent application.

TECHNICAL FIELD

The present application mainly relates to the crystalline silicon solar cells, and in particular to back contact solar cell and solar cell module.

BACKGROUND

As the photovoltaic industry continues to pursue efficiency improvements and cost reductions, since traditional PERC (Passivated Emitter and Rear Cell) cells are approaching the theoretical limit of their conversion efficiency, leaving little room for cost reduction, while the market's pursuit of higher photoelectric conversion efficiency will not stop, the field is eager to seek the next generation of high-efficiency technologies. The mainstream technologies currently being promoted include tunnel oxide passivation contact battery TOPCon, heterojunction battery HJT and back contact cell IBC, etc.

Wherein, the metal electrode of the IBC cell is located on the back surface of the cell, and the front surface is not blocked by the metal electrode, which improves the utilization of light and has a higher short-circuit current. However, how to improve the structural details of existing back contact cells to further improve their photoelectric conversion efficiency has always been an important topic of continued research in this field.

SUMMARY

The technical problem to be solved by the present invention is to provide a back contact solar cell and solar cell module, which can take into account the electrical and optical properties of solar cells and further improve the short-circuit current, open-circuit voltage and photoelectric conversion efficiency of solar cells.

In order to solve the above technical problems, the present application provides a back contact solar cell, comprising: a substrate, provided with a substrate front surface and a substrate back surface opposite to each other, wherein the substrate front surface is close to a main-light-receiving surface of the cell, and the substrate back surface is close to a non-main-light-receiving surface of the cell; P-type polarity region, including a first doped semiconductor layer; N-type polarity region, including a second doped semiconductor layer, the N-type polarity region and the P-type polarity region are alternately located on side of the substrate back surface, wherein, a thickness of the second doped semiconductor layer along a normal direction of the cell is smaller than a thickness of the first doped semiconductor layer along the normal direction; and an isolation region, located between each two adjacent N-type polarity region and P-type polarity region.

Optionally, a doping type of the first doped semiconductor layer is P-type doping, and doping impurities include boron atoms and/or boron-containing compounds; a doping type of the second doped semiconductor layer is N-type doping, and doping impurities include phosphorus atoms and/or phosphorus-containing compounds Optionally, the thickness of the first doped semiconductor layer ranges from 15 nm to 500 nm, and the thickness of the second doped semiconductor layer ranges from 10 nm to 400 nm.

Optionally, the thickness of the second doped semiconductor layer along the normal direction is 30 nm to 150 nm thinner than the thickness of the first doped semiconductor layer along the normal direction.

Optionally, when a conductivity type of the substrate is opposite to a conductivity type of the P-type polarity region, a width of the P-type polarity region along an extending direction of the cell perpendicular to the normal direction is greater than a width of the adjacent N-type polarity region along the extending direction; when a conductivity type of the substrate is the same as a conductivity type of the P-type polarity region, a width of the N-type polarity region along the extending direction is greater than a width of the adjacent P-type polarity region along the extending direction.

Optionally, a width of the isolation region along the extending direction is smaller than the width of any P-type polarity regions or any N-type polarity regions along the extending direction.

Optionally, further comprising a first substrate doped layer located at a position in the substrate corresponding to the P-type polarity region, and the first substrate doped layer is adjacent to the substrate back surface in the substrate.

Optionally, further comprising a first doped oxide layer with a thickness ranging from 0.5 nm to 3 nm in the P-type polarity region, and the first doped oxide layer is located adjacent to a side of the first doped semiconductor layer close to the substrate back surface Optionally, further comprising a second substrate doped layer located at a position in the substrate corresponding to the N-type polarity region, and the second substrate doped layer is adjacent to the substrate back surface in the substrate.

Optionally, further comprising a second doped oxide layer with a thickness ranging from 0.5 nm to 3 nm in the N-type polarity region, and the second doped oxide layer is located adjacent to a side of the second doped semiconductor layer close to the substrate back surface.

Optionally, further comprising a backside passivation layer located at an outermost layer away from the substrate back surface of the N-type polarity region, the P-type polarity region and the isolation region.

Optionally, the backside passivation layer includes a dielectric layer formed by one of or a stacked dielectric layer formed by two or more of aluminum oxide, silicon nitride, silicon oxynitride, and silicon oxide.

Optionally, further comprising a first electrode and a second electrode, respectively located in the P-type polarity region and the N-type polarity region, the first electrode and the second electrode respectively passing through the backside passivation layer and in connection to the first doped semiconductor layer and the second doped semiconductor layer.

Optionally, further comprising a front passivation layer, located on side of the substrate front surface, and the front passivation layer includes a dielectric layer formed by one of or a stacked dielectric layer formed by two or more of aluminum oxide, silicon nitride, silicon oxynitride, silicon oxide, and magnesium fluoride.

Optionally, further comprising a front surface field in the substrate adjacent to substrate front surface, and a doping type of the front surface field is the same as a doping type of the substrate, and a doping concentration of the front surface field is higher than the substrate.

Another aspect of the present invention also provides a solar cell module comprising a plurality of above-mentioned back contact solar cell connected in series and/or in parallel.

Compared with the existing technology, this application applies a characteristic layer with good passivation effect for IBC back contact solar cells, and sets the different polarity areas on the back of the battery to have differentiated specific widths and thicknesses, thereby enabling the back-contact cell with improved structural details taking into account the electrical and optical properties of the solar cell, further improving the short-circuit current, open-circuit voltage and photoelectric conversion efficiency of the solar cell.

BRIEF DESCRIPTION OF THE DRAWINGS

The drawings are included to provide a further understanding of the present application, and they are included and constitute a part of the present application, the drawings show the embodiments of the present application, and serving to explain the principles of the present application together with the description. In the drawings:

FIG. 1 is a schematic structural view of a back contact solar cell in an embodiment of the present application.

PREFERRED EMBODIMENT OF THE PRESENT INVENTION

In order to illustrate the technical solutions in the embodiments of the present application more clearly, the drawings that need to be used in the description of the embodiments will be briefly introduced below. Obviously, the drawings in the following description are only some embodiments of the present application, and for those skilled in the art, other drawings can also be obtained based on these drawings without creative effort.

As indicated in this application and claims, the terms "a", "an", "a kind of" and/or "the" do not specifically refer to the singular and may include the plural unless the context clearly indicates an exception. Generally speaking, the terms "comprising" and "including" only suggest the inclusion of clearly identified steps and elements, and these steps and elements do not constitute an exclusive list, and the method or device may also contain other steps or elements.

The relative arrangements of components and steps, numerical expressions and numerical values set forth in these embodiments do not limit the scope of the present application unless specifically stated otherwise. At the same time, it should be understood that, for the convenience of description, the sizes of the various parts shown in the drawings are not drawn according to the actual proportional relationship. Techniques, methods and devices known to those of ordinary skill in the relevant art may not be discussed in detail, but where appropriate, such techniques, methods and devices should be considered part of the authorized specification. In all embodiments shown and discussed herein, any specific values should be construed as illustrative only, and not as limiting. Therefore, other examples of the exemplary embodiment may have different values. It should be noted that like numerals and letters denote like items in the following FIGURES, therefore, once an item is defined in one FIGURE, it does not require further discussion in subsequent drawings.

In the description of the present application, it should be understood that orientation words such as "front, back, up, down, left, right", "landscape, portrait, vertical, horizontal" and "top, bottom" etc. indicating the orientation or positional relationship is generally based on the orientation or positional relationship shown in the drawings, only for the convenience of describing the application and simplifying the description, in the absence of a contrary statement, these orientation words do not indicate or imply that the device or element referred to must have a specific orientation or be constructed and operated in a specific orientation, and therefore cannot be construed as limiting the scope of protection of this application; the orientation words "inside and outside" refer to inside and outside relative to the outline of each part itself.

For the convenience of description, spatially relative terms may be used here, such as "on . . . ", "over . . . ", "on the upper surface of . . . ", "above", etc., to describe the spatial positional relationship between one device or feature and other devices or features. It will be understood that, in addition to the orientation depicted in the drawings, the spatially relative terms are intended to encompass different orientations of the device in use or operation. For example, if the device in the drawings is turned over, devices described as "on other devices or configurations" or "above other devices or configurations" would then be oriented "beneath other devices or configurations" or "under other devices or configurations". Thus, the exemplary term "above" can encompass both an orientation of "above" and "beneath". The device may be otherwise oriented (rotated 90 degrees or at other orientations), and making a corresponding explanation for the space relative description used here.

In addition, it should be noted that the use of words such as "first" and "second" to define components is only for the convenience of distinguishing corresponding components, unless otherwise stated, the above words have no special meanings, and therefore cannot be construed as limiting the protection scope of the present application. In addition, although the terms used in this application are selected from well-known and commonly used terms, some terms mentioned in the specification of this application may be selected by the applicant according to his or her judgment, and their detailed meanings are listed in this article described in the relevant section of the description. Furthermore, it is required that this application be understood not only by the actual terms used, but also by the meaning implied by each term.

This application proposes a schematic structural view of a back contact solar cell 10 (hereinafter referred to as the cell 10) with reference to FIG. 1. The cell 10 mainly includes a substrate 101, a P-type polarity region 102, an N-type polarity region 103 and an isolation region 104. Specifically, the substrate 101 is provided with a substrate front surface 1011 and a substrate back surface 1012 opposite to each other, wherein the substrate front surface 1011 is close to a main-light-receiving surface of the cell 10 (the illumination direction S in FIG. 1 indicates that the uppermost surface of the cell 10 is the main-light-receiving surface when the cell 10 is placed in the manner shown in FIG. 1). Specifically, the substrate front surface 1011 is usually a suede structure, including a pyramid suede surface and/or an etched pit suede surface. Correspondingly, the substrate back surface 1012 is close to the non-main-light-receiving surface of the cell 10, and for example, the non-main-light-receiving surface may be polished surface structure, including conventional alkali polished surface.

Further, in this embodiment, the above mentioned P-type polarity region 102 includes a first doped semiconductor layer 1021. In this embodiment, preferably, the thickness range of the first doped semiconductor layer 1021 is 15 nm-500 nm, preferably 150 nm-250 nm, 250 nm-350 nm, 350 nm-450 nm, 50 nm-150 nm, and can be freely set according to the actual production and manufacturing conditions. The doping type of the first doped semiconductor layer 1021 is P-type doping, and the doping impurities include P-type doped polysilicon such as boron atoms and/or boron-containing compounds.

On this basis, the N-type polarity region 103 includes a second doped semiconductor layer 1031. Preferably, the thickness of the second doped semiconductor layer 1031 in this embodiment ranges from 10 nm to 400 nm, preferably 100 nm to 200 nm, 200 nm to 300 nm, 300 nm to 400 nm, and 40 nm to 140 nm. The doping type of the second doped semiconductor layer 1031 is N-type doping, and the doping impurities include phosphorus atoms and/or phosphorus-containing compounds.

Preferably, in various embodiments of the present application including FIG. 1, the thickness of the second doped semiconductor layer 1031 is 30 nm-150 nm thinner than the thickness of the first doped semiconductor layer 1021, wherein a preferred range of the thickness difference is 50 nm, 100 nm or any value between 50 nm-100 nm.

Although only a partial structure of the cell 10 is shown in FIG. 1, it can be understood that in this embodiment, the N-type polarity region 103 and the P-type polarity region 102 are alternately located on side of the substrate back surface 1012, and an isolation region is located between each two adjacent N-type polarity region and P-type polarity region. For example, the isolation region 104 may have a suede surface and/or polished surface structure. Since the conductive polarities of the N-type polarity region 103 and the P-type polarity region 102 are opposite, by providing the isolation region 104 between them, it is possible to prevent an electrical connection between a positive electrode and a negative electrode of the cell 10 which will result in short circuit.

In this embodiment, preferably, the thickness of the second doped semiconductor layer 1031 along the normal direction x of the cell 10 is smaller than the thickness of the first doped semiconductor layer 1021 along the normal direction. Specifically, since the P-type polarity region 102 is P-type doped, and the doping impurities include boron atoms and/or boron-containing compounds, the solid solubility of the doping impurities in silicon will be low, making doping more difficult, therefore a thicker doping layer is required to reduce sheet resistance. The N-type polarity region 103 is N-type doped, and its doping difficulty is low, therefore in the cell 10, based on the above technical considerations, it is preferable to reduce the thickness of the N-type polarity region 103 (especially the second doped semiconductor layer 1031 therein) to reduce the absorption loss of irradiation light, improving the short-circuit current and conversion efficiency. Through the design of the cell 10, the light loss of the cell 10 can be reduced, the short-circuit current and conversion efficiency can be improved, and due to the thickness difference of the first doped semiconductor layer 1021 in the P-type polarity region 102 and the second doped semiconductor 1031 in the N-type polarity region 103, both the electrical and optical properties of the cell 10 can be taken into consideration.

To be more specific, the conductivity type of the substrate 101 in this application is not unique, and depending on different conductivity type of the substrate 101, a width of the back polarity region of the cell 10 will be set differently. In order to better understand the setting of the width, any adjacent and sequentially arranged N-type polarity region 103, isolation region 104 and P-type polarity region 102 on the back of the cell 10 is regarded as a polarity region group. In this embodiment, preferably, when the conductivity type of the substrate 101 is opposite to the conductivity type of the P-type polarity region 102, the width of the P-type polarity region 102 along the extending direction, the y direction, of the cell 10 (perpendicular to the normal direction x direction) is greater than the sum of the widths of an N-type polarity region 103 and an isolation region 104 adjacent to the P-type polarity region 102 along the extending direction, the y direction, in the same polarity region group, and FIG. 1 illustrates this situation.

On the other hand, in some modified embodiments based on FIG. 1, when the conductivity type of the substrate 101 is the same as the conductivity type of the P-type polarity region 102, the width of the N-type polarity region 103 along the extending direction y is greater than the sum of the widths of an adjacent P-type polarity region 102 and an isolation region 104 along the extending direction in the same polar region group.

Specifically, on the back side of the cell 10, a polarity region opposite to the conductivity type of the semiconductor substrate 101 will form a PN junction with the substrate 101, and by setting the above width, in embodiments with different substrate conductivity types, the PN junction area of the cell accounts for a larger proportion than the non-PN junction area, which is beneficial to the separation and collection of carriers, thereby improving the filling factor and conversion efficiency of the solar cell.

In this embodiment, the P-type polarity region 102 also includes a first doped oxide layer 1022, the doping type of which is P-type doping, located on the side of the first doped semiconductor layer 1021 close to the substrate back surface 1012. The first doped oxide layer 1022 includes silicon oxide and/or aluminum oxide. The thickness of the first doped oxide layer 1022 ranges from 0.5 nm~3 nm, preferably 1 nm to 2 nm. Further, the substrate 101 further includes a first substrate doping layer 1023 at a position corresponding to the P-type polarity region 102, the doping type of which is P-type, and is adjacent to the substrate back surface 1012 in the substrate 101. In this embodiment, the first doped oxide layer 1022 is adjacent to the substrate back surface 1012 of the substrate 101, that is, it is adjacent to the first substrate doped layer 1023.

Referring to FIG. 1 on the other hand, the N-type polarity region 103 also includes a second doped oxide layer 1032, including silicon oxide and/or aluminum oxide, located adjacent on a side of the second doped semiconductor layer 1031 close to the substrate back surface 1012. Similarly, the thickness of the second doped oxide layer 1032 ranges from 0.5 nm~3 nm, preferably 1 nm~2 nm. The substrate 101 also includes a second substrate doping layer 1033 at a position corresponding to the N-type polarity region 103, the doping type of a second substrate doping layer 1033 is N-type, and is located adjacent to the substrate back surface 1012 in the substrate 101, the second doped oxide layer 1032 is adjacent to the substrate back surface 1012 in the substrate 101, that is, adjacent to the second substrate doped layer 1023.

Specifically, on the premise that the doping types of the second doped semiconductor layer 1031 and the first doped semiconductor layer 1021 are opposite, the doping type of the second substrate doped layer 1033 is opposite to that of the first substrate doped layer 1023, the doping type of the second doped oxide layer 1032 is opposite to that of the first doped oxide layer 1022, and is N-type doped, including N-type doped polysilicon such as phosphorus atoms, phosphorus ions, and/or phosphorus-containing compounds.

Based on the above structure, the cell 10 also includes a back passivation layer 105, located at an outermost layer of the N-type polarity region, the P-type polarity region and the isolation region away from the substrate back surface (referring to FIG. 1, it can be understood that it continuously extends to form the outermost side of the back surface of the cell 10, and the outermost side of the backside passivation layer 105 also constitutes the non-main-light-receiving surface of the cell). The backside passivation layer 105 includes a dielectric layer formed by one of or a stacked dielectric layer formed by two or more of aluminum oxide, silicon nitride, silicon oxynitride, silicon oxide.

In contrast, the cell 10 also includes a front passivation layer 106 located on side of the substrate front surface 1011, and the front passivation layer 106 includes a dielectric layer formed by one of or a stacked dielectric layer formed by two or more of aluminum oxide, silicon nitride, silicon oxynitride, silicon oxide, and magnesium fluoride.

In this embodiment, the cell 10 further includes a plurality of first electrodes 107 located in each P-type polarity region 102. The first electrode 107 passes through the backside passivation layer 105 in the P-type polarity region and forms electrical contact with the first doped semiconductor layer 1021. Wherein, the material of the first electrode 107 includes conductive metals such as silver, copper and their compounds, etc. Similarly, cell 10 also includes a plurality of second electrodes 108 located in each N-type polarity region 102. In the N-type polarity region, The second electrode 108 passes through the backside passivation layer 105 and forms electrical contact with the second doped semiconductor layer 1031. Wherein, the material of the second electrode 108 also includes conductive metals such as silver, copper and their compounds.

Optionally, the cell 10 also includes a front surface field 109 located adjacent to the substrate front surface 1011 in the substrate 101, the doping type of the front surface field 109 is the same as the doping type of the substrate 101, and the doping concentration of the front surface field 109 is higher than that of the substrate 101. The thickness range of the front surface field 109 is preferably 0.005 um-5 um, and the sheet resistance is 10-10000 ohm/sq. In this implementation, due to the front surface field 109, the function of the front surface field 109 is to reduce carrier recombination, thereby further improving the open circuit voltage and conversion efficiency of the solar cell.

Based on the above description, another aspect of this application also proposes a cell module, comprising a plurality of back contact solar cell according to any one of embodiments in this application connected in series and/or in parallel.

The back contact solar cell and the cell module for its application proposed in this application have optimized the parameters of the length and width dimensions in different polarity regions on the back structure of the back contact solar cell, which can take into account the electrical and electrical properties of the solar cell, further improving the short-circuit current, open-circuit voltage and photoelectric conversion efficiency of solar cells.

The basic concepts have been described above, obviously, for those skilled in the art, the above disclosure of the invention is only an example, and does not constitute a limitation to the present application. Although not expressly stated here, various modifications, improvements and amendments to this application may be made by those skilled in the art. Such modifications, improvements, and amendments are suggested in this application, so such modifications, improvements, and amendments still belong to the spirit and scope of the exemplary embodiments of this application.

Meanwhile, the present application uses specific words to describe the embodiments of the present application. For example, "one embodiment", "an embodiment", and/or "some embodiments" refer to a certain feature, structure or characteristic related to at least one embodiment of the present application. Therefore, it should be emphasized and noted that two or more references to "one embodiment" or "an embodiment" or "an alternative embodiment" in different places in this specification do not necessarily refer to the same embodiment. In addition, certain features, structures or characteristics of one or more embodiments of the present application may be properly combined.

In the same way, it should be noted that in order to simplify the expression disclosed in the present application and help the understanding of one or more embodiments of the invention, in the foregoing description of the embodiments of the present application, sometimes multiple features are combined into one embodiment, drawings or descriptions thereof. However, this method of disclosure does not imply that the subject matter of the application requires more features than are recited in the claims. Indeed, embodiment features are less than all features of a single foregoing disclosed embodiment.

In some embodiments, numbers describing the quantity of components and attributes are used, it should be understood that such numbers used in the description of the embodiments use the modifiers "about", "approximately" or "substantially" in some examples. Unless otherwise stated, "about", "approximately" or "substantially" indicates that the stated FIGURE allows for a variation of ±20%. Accordingly, in some embodiments, the numerical parameters used in the specification and claims are approximations that can vary depending upon the desired characteristics of individual embodiments. In some embodiments, numerical parameters should take into account the specified significant digits and adopt the general digit reservation method. Although the numerical ranges and parameters used in some embodiments of the present application to confirm the breadth of the scope are approximate values, in specific embodiments, such numerical values are set as precisely as practicable.

Although the present application has been described with reference to the current specific embodiments, those of ordinary skill in the art should recognize that the above embodiments are only used to illustrate the present application, and various equivalent changes or substitutions can also be made without departing from the spirit of the present application, therefore, as long as the changes and modifications to the above-mentioned embodiments are within the spirit of the present application, they will all fall within the scope of the claims of the present application.

The invention claimed is:

1. A back contact solar cell, comprising:
 a substrate, provided with a substrate front surface and a substrate back surface opposite to each other, wherein the substrate front surface is close to a main-light-receiving surface of the cell, and the substrate back surface is close to a non-main-light-receiving surface of the cell, and a doping type of the substrate is N-type;

P-type polarity region, including a first doped semiconductor layer;

N-type polarity region, including a second doped semiconductor layer, the N-type polarity region and the P-type polarity region are alternately located on the substrate back surface, wherein, a thickness of the second doped semiconductor layer along a normal direction of the cell is smaller than a thickness of the first doped semiconductor layer along the normal direction, a width of the P-type polarity region along an extending direction of the cell perpendicular to the normal direction is greater than a width of the adjacent N-type polarity region along the extending direction;

an isolation region, located between each two adjacent N-type polarity region and P-type polarity region, and the isolation region extends into the substrate along the normal direction;

a first substrate doped layer, located at a position in the substrate corresponding to the P-type polarity region, and the first substrate doped layer is adjacent to the substrate back surface in the substrate; and a second substrate doped layer, located at a position in the substrate corresponding to the N-type polarity region, and the second substrate doped layer is adjacent to the substrate back surface in the substrate, wherein, the isolation region separates the first substrate doped layer and the second substrate doped layer in the extending direction, and the isolation region in the substrate extends further into the substrate than the first substrate doping layer and the second substrate doping layer.

2. The back contact solar cell according to claim 1, wherein,
doping impurities of the first doped semiconductor layer include boron atoms and/or boron-containing compounds;
doping impurities of the second doped semiconductor layer include phosphorus atoms and/or phosphorus-containing compounds.

3. The back contact solar cell according to claim 1, wherein, the thickness of the first doped semiconductor layer ranges from 15 nm to 500 nm, and the thickness of the second doped semiconductor layer ranges from 10 nm to 400 nm.

4. The back contact solar cell according to claim 1, wherein, the thickness of the second doped semiconductor layer along the normal direction is 30 nm to 150 nm thinner than the thickness of the first doped semiconductor layer along the normal direction.

5. The back contact solar cell according to claim 1, wherein, a width of the isolation region along the extending direction is smaller than the width of any P-type polarity regions or any N-type polarity regions along the extending direction.

6. The back contact cell according to claim 1, further comprising a first doped oxide layer with a thickness ranging from 0.5 nm to 3 nm in the P-type polarity region, and the first doped oxide layer is located adjacent to a side of the first doped semiconductor layer close to the substrate back surface.

7. The back contact solar cell according to claim 6, further comprising a second doped oxide layer with a thickness ranging from 0.5 nm to 3 nm in the N-type polarity region, and the second doped oxide layer is located adjacent to a side of the second doped semiconductor layer close to the substrate back surface.

8. The back contact solar cell according to claim 1, further comprising a backside passivation layer located at an outermost layer away from the substrate back surface of the N-type polarity region, the P-type polarity region and the isolation region.

9. The back contact solar cell according to claim 8, wherein, the backside passivation layer includes a dielectric layer formed by one of or a stacked dielectric layer formed by two or more of aluminum oxide, silicon nitride, silicon oxynitride, and silicon oxide.

10. The back contact solar cell according to claim 9, further comprising a first electrode and a second electrode, respectively located in the P-type polarity region and the N-type polarity region, the first electrode and the second electrode respectively passing through the backside passivation layer and in connection to the first doped semiconductor layer and the second doped semiconductor layer.

11. The back contact solar cell according to claim 1, further comprising a front passivation layer, located on side of the substrate front surface, and the front passivation layer includes a dielectric layer formed by one of or a stacked dielectric layer formed by two or more of aluminum oxide, silicon nitride, silicon oxynitride, silicon oxide, and magnesium fluoride.

12. The back contact solar cell according to claim 1, further comprising a front surface field in the substrate adjacent to substrate front surface, and a doping type of the front surface field is the same as a doping type of the substrate, and a doping concentration of the front surface field is higher than the substrate.

13. A solar cell module comprising a plurality of back contact solar cell according to claim 1 connected in series and/or in parallel.

14. The solar cell module according to claim 13, wherein a width of the isolation region along the extending direction is smaller than the width of any P-type polarity regions or any N-type polarity regions along the extending direction.

15. The back contact solar cell according to claim 7, wherein, the isolation region separates the first doped oxide layer and the second doped oxide layer in the extending direction.

* * * * *